US012635503B2

(12) United States Patent
Nogami et al.

(10) Patent No.: US 12,635,503 B2
(45) Date of Patent: May 19, 2026

(54) GRAPHENE COATED INTERCONNECTS WITH AIRGAP STRUCTURES

(71) Applicant: International Business Machines Corporation, Armonk, NY (US)

(72) Inventors: Takeshi Nogami, Schenectady, NY (US); Son Nguyen, Schenectady, NY (US); Cornelius Brown Peethala, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 542 days.

(21) Appl. No.: 18/147,731

(22) Filed: Dec. 29, 2022

(65) Prior Publication Data

US 2024/0222278 A1      Jul. 4, 2024

(51) Int. Cl.
H10W 20/41          (2026.01)
H10W 20/00          (2026.01)
H10W 20/46          (2026.01)

(52) U.S. Cl.
CPC ....... H10W 20/425 (2026.01); H10W 20/039 (2026.01); H10W 20/063 (2026.01); H10W 20/072 (2026.01); H10W 20/46 (2026.01)

(58) Field of Classification Search
CPC ......... H01L 23/53266; H01L 21/76852; H01L 21/7682; H01L 21/76885; H10W 20/425; H10W 20/46
See application file for complete search history.

(56) References Cited

U.S. PATENT DOCUMENTS

| | | | |
|---|---|---|---|
| 7,569,475 B2 | 8/2009 | Yang | |
| 8,232,646 B2 | 7/2012 | Bonilla | |
| 8,476,765 B2 | 7/2013 | Zhang | |
| 8,623,761 B2 | 1/2014 | Bonilla | |
| 8,716,863 B2 | 5/2014 | Wann | |
| 8,901,744 B2 | 12/2014 | Yang | |
| 9,000,594 B2 | 4/2015 | Ott | |
| 9,293,412 B2 | 3/2016 | Bao | |
| 10,319,632 B2 | 6/2019 | Yang | |
| 10,978,342 B2 | 4/2021 | Huang | |
| 11,094,631 B2 | 8/2021 | Yang | |
| 11,205,591 B2 * | 12/2021 | Cheng | H01L 21/76877 |
| 2021/0398898 A1 * | 12/2021 | Yang | H01L 21/76885 |
| 2022/0013467 A1 * | 1/2022 | Lee | H10B 12/05 |
| 2022/0068703 A1 | 3/2022 | Bao | |
| 2022/0139823 A1 * | 5/2022 | Lin | H01L 21/76841 |
| | | | 257/774 |
| 2022/0262738 A1 * | 8/2022 | Lee | H01L 23/53266 |

* cited by examiner

*Primary Examiner* — Daniel Luke
(74) *Attorney, Agent, or Firm* — Stephen R. Yoder

(57) ABSTRACT

An integrated circuit configuration with graphene coated metal interconnect structures and airgap structures between the graphene coated metal interconnect structures and method for fabrication of the integrated circuit configuration may be provided. The structure may include a metal interconnect structure in contact with an electrode upon a substrate fabricated through subtractive metal reactive ion etching. The metal interconnect structure may have a thin coating of hydrophobic graphene surrounding the exterior of the metal interconnect structure to prevent oxidation of the metal interconnect and to prevent parasitic capacitance. The structure may further include one or more air gap structures formed upon the substrate and in between the graphene coated metal interconnect structures and capped with a dielectric layer.

8 Claims, 4 Drawing Sheets

500

600

GRAPHENE COATED INTERCONNECTS WITH AIRGAP STRUCTURES

BACKGROUND OF THE INVENTION

The present invention relates generally to the field of integrated circuits, and more particularly to graphene coated metal subtractive interconnects with airgap structures and their formation.

Integrated circuits commonly include electrically conductive microelectronic structures known as interconnects. Copper has been used as the primary interconnect conducting metal. Other metals such as Ru, W, and Cobalt, Rhodium, Iridium, AlCu, CuMnx have been used as interconnects also. Fabrication of integrated circuits with these metals required a process of subtractive reactive ion etching. Low dielectric constant materials are necessary for efficient use of interconnects. Air gaps within an integrated circuit fit this need, as air gaps have dielectric constants around 1 (humidity depending).

Graphene has been used in many areas, integrated circuits notwithstanding. The benefits of this material continue to be explored in numerous technologies. However, graphene is difficult to work with, thus lessening its use. Some of the many benefits of graphene include a low dielectric constant, excellent moisture resistance with good Hydrophobic properties, and ability to exist in sheets a single atom thick.

SUMMARY

The present invention may disclose a method of forming a graphene coated metal interconnect structure with airgap structure. According to an embodiment the method may comprise forming a first metal interconnect pillar structure and a second metal interconnect structure via subtractive reactive ion etch processing over a substrate. The embodiment may also comprise selectively depositing a graphene layer coating onto sidewalls of the first and second metal interconnect pillar structures. The embodiment may further comprise creating an airgap structure between the first and second metal interconnect pillar structures by depositing a dielectric layer between the first and second metal interconnect pillar structures, and in contact with a top portion of the graphene layer coating the sidewalls of the first and second metal interconnect pillar structures. The method may further include the fabrication process step to form these airgap structure with various substrative and damascene metal.

According to one embodiment of the present invention, graphene coated metal interconnect structure with an airgap structure may be provided. The embodiment may comprise a first electrode and a second electrode in contact with a substrate. The embodiment may further comprise a first metal interconnect pillar structure in electrical contact with the first electrode and a second metal interconnect pillar structure in electrical contact with the second electrode. The embodiment may additionally comprise a graphene layer coating sidewalls of the first and second metal interconnect pillar structures. The embodiment may also comprise a dielectric layer located between the first and second metal interconnect pillar structures, and in contact with a top portion of the graphene layer coating the sidewalls of the first and second metal interconnect pillar structures. The embodiment may comprise an airgap structure located between the first and second metal interconnect pillar structures, and in contact with a bottom portion of the graphene layer coating the sidewalls of the first and second metal interconnect pillar structures.

BRIEF DESCRIPTION OF THE SEVERAL VIEWS OF THE DRAWINGS

The following detailed description, given by way of example and not intend to limit the disclosure solely thereto, will best be appreciated in conjunction with the accompanying drawings, in which:

When viewed as ordered combinations, FIGS. 2-6 illustrate both (i) semiconductor devices and (ii) the methods for forming such semiconductor devices, in accordance with illustrative embodiments.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
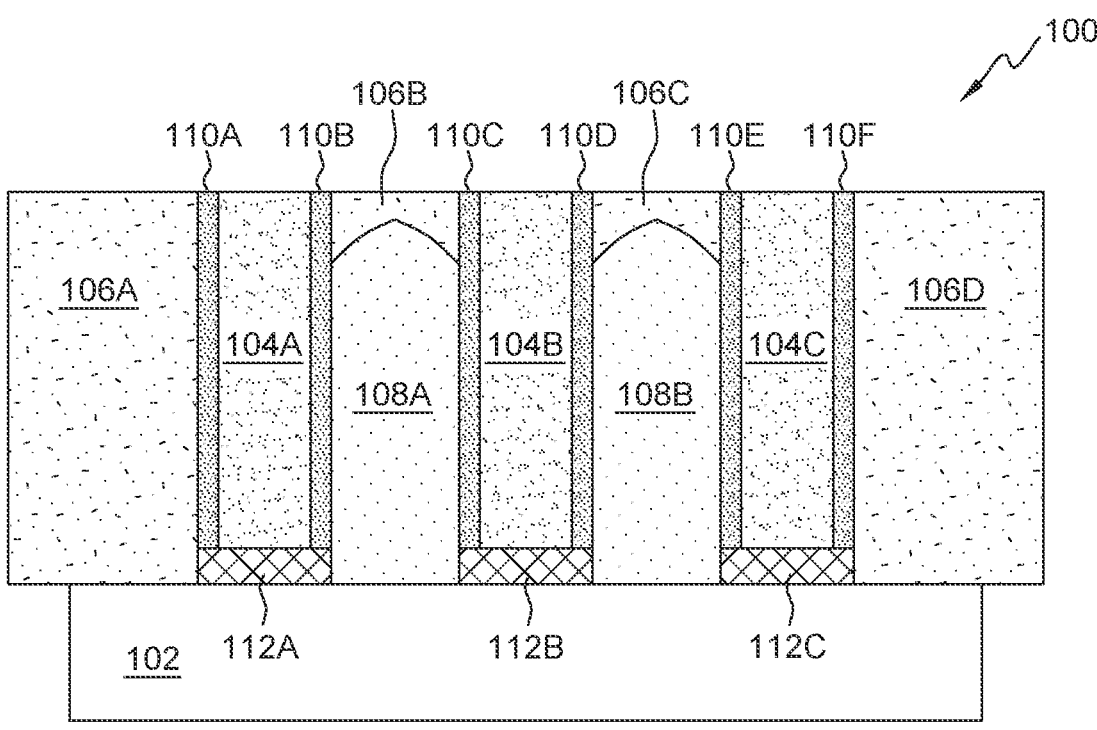
FIG. 1 illustrates a cross-sectional view of graphene coated metal interconnect structure with air gap, generally designated 100, in accordance with at least one embodiment of the present invention.

The present invention relates generally to the field of integrated circuit packaging, and more particularly to graphene coated metal interconnects structure with airgaps.

Embodiments of the present invention recognize that during the fabrication process of subtractive reactive ion etching, a thin layer (0.5-1.0 nm) of metal oxide can form post-processing and impact the resistance of the interconnect structure. Further, simply removing the metal oxide by means of hydrogen plasma is not an effective solution because it will simply reform upon completion of the removal process. Embodiments of the present invention address the matter of increased resistance due to the formation of metal oxide through selectively depositing hydrophobic graphene on a metal interconnect pillar, which can be an effective method to reduce the metal oxide formation and improve resistance of the metal interconnect pillar. The metal oxide reduction is highly more effective with the present of Hydrogen reactants (as in plasma or thermal deposition) typical present during hydrophobic graphene deposition.

Embodiments of the present invention further recognize that an etching stop layer formed on top of metal interconnect structures must act as a diffusion or moisture barrier between the metal interconnect layer and atmosphere or airgap. Materials used in the etching stop layer process generally form layers about 4 nm thick. In structures with sub-20 nm pitches, the thick layer of etching stop material leaves insufficient space for effective air gaps within the semiconductor structure. Another concern with regard to etching stop layer materials (e.g., AlO, SiCO, and SiCN) is the high dielectric constant. This can lead to an increase in parasitic capacitance of the metal interconnect structure. The deposition of a thin hydrophobic graphene cap roughly 0.2-1.0 nm on metal interconnects provides a sufficient moisture barrier and allows for enough air gap volume within a sub-20 nm trench. The thin hydrophobic graphene cap also has a lower dielectric constant, thus reducing potential metal interconnect parasitic capacitance. In fact, most of the deposited graphene layer is conducting thus has little dielectric constant impact.

Embodiments of the present invention also recognize metals generally suitable for formation of interconnect structures via reactive ion etch (e.g., Ru, Co, Rh, Ir, Ta and W) typically have higher a resistance than other metals. To address the increased resistance, a hydrophobic graphene cap wrapped around three sides of the metal interconnect structure enhances the conductivity through the reduction of metal oxide formation and enhanced electron mobility.

Exemplary embodiments now will be described more fully herein with reference to the accompanying drawings, in which exemplary embodiments are shown. In the following detailed description, numerous specific details are set forth in order to provide a thorough understanding of various embodiments of the invention. However, it is to be understood that embodiments of the invention may be practiced without these specific details. As such, this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is focused on the distinctive features or elements of various embodiments of the present invention.

As used herein, terms such as "depositing," "forming," and the like may refer to the disposition of layers, or portions of materials, in accordance with a given embodiment. Such processes may or may not be different than those used in the standard practice of the art of micro-cooler device fabrication. Such processes include, but are not limited to, atomic layer deposition (ALD), molecular layer deposition (MLD), chemical vapor deposition (CVD), low-pressure chemical vapor deposition (LPCVD), plasma enhanced chemical vapor deposition (PECVD), limited reaction processing CVD (LRPCVD), ultrahigh vacuum chemical vapor deposition (UHVCVD), metalorganic chemical vapor deposition (MOCVD), physical vapor deposition, sputtering, plating, electroplating, evaporation, ion beam deposition, electron beam deposition, laser assisted deposition, chemical solution deposition, or any combination of those methods.

As used herein, terms, such as "forming," and the like, may refer to processes that alter the structure and/or composition of one or more layers of material or portions of materials in accordance with a given embodiment. For example, such formation processes may include, but are not limited to, exposure to a specific frequency or range of frequencies of electromagnetic radiation, ion implantation techniques, and/or chemical/mechanical polishing (CMP). As used herein, terms, such as "forming," and the like, may refer to processes that alter the structure of one or more layers of material, or portions of material(s), by removal of a quantity of material, in accordance with a given embodiment. For example, such formation processes may include, but are not limited to, micromachining, micro etching, wet and/or dry etching processes, plasma etching processes, or any of the known etching processes in which material is removed.

Those skilled in the art understand that many different techniques may be used to add, remove, and/or alter various materials, and portions thereof, and that embodiments of the present invention may leverage combinations of such processes to produce the structures disclosed herein without deviating from the scope of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Some of the process steps, depicted, can be combined as an integrated process step. In addition, descriptions of well-known functions and constructions may be omitted for clarity and conciseness.

Detailed embodiments of the claimed structures and methods are disclosed herein. The method steps described below do not form a complete process flow for manufacturing integrated circuits on semiconductor chips. The present embodiments can be practiced in conjunction with the integrated circuit fabrication techniques for semiconductor chips and devices currently used in the art, and only so much of the commonly practiced process steps are included as are necessary for an understanding of the described embodiments. The Figures represent cross-section portions of various semiconductor structures and sub-assembly structures, and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

The present invention will now be described in detail with reference to the Figures, wherein like reference numerals refer to like elements throughout. FIGS. 1-7 include various cross-sectional views depicting illustrative steps of a method, and the resulting structures thereof, for manufacturing semiconductor devices, and in particular, a semiconductor structure comprising at least two metal interconnect pillar structures fabricated by subtractive reactive ion etching with hydrophobic graphene cap and airgap structure formed between the metal interconnect pillar structures, according to select embodiments of the present invention. One having ordinary skill in the art will appreciate that there are many options available for the formation of the structures described herein and that the following discussion does not limit embodiments to only the techniques described herein.

Referring now to FIG. 1, FIG. 1 illustrates a cross-sectional view of graphene coated metal interconnect structure with airgap, generally designated 100, in accordance with at least one embodiment of the present invention. Graphene coated metal interconnect structure with airgap is comprised of substrate 102 as a base. Seated on top of substrate 102 is electrode 112A 112B, and 112C, also seated on top of substrate 102 is dielectric 106A and 106D. Dielectric 106A is shown on the far left and dielectric 106D is shown on the far right of FIG. 1 in contact on both respective interior sides with graphene layer 110A and 110F, respectively. Dielectric 106B and 106C also sits on top of air gap 108A and 108B, respectively, in a bridge formation closing the airgap effectively from the atmosphere. Dielectric 106B and 106C also sits in between the upper portion of graphene coated metal interconnect structure with air gap 100. Metal interconnect structure 104A sits on electrode 112A. The vertical sides of metal interconnect structure 104A are in contact with graphene layer 110A on the left vertical side and 110B on the right vertical side. The top horizontal portion of interconnect structure 104 is shown in horizontal plane with dielectric 106A, 106B, 106C and 106D as well as the top portion of graphene layer 110A, 110B, 110C, 110D, 110E, and 110F.

In an embodiment, graphene coated metal interconnect structure with airgap 100 is fabricated via subtractive metal reactive ion etching ("RIE"). Subtractive metal RIE is an ideal procedure for fabricating metal interconnects and back-end-of-line sections. embodiments of the present invention form the body of metal via and trench in the subtractive RIE metal line formation. The vias are formed through a metal gap fill in via holes without employing damascene via chemical mechanical planarization (CMP) processes. The metal films formed on the field during the via metal fill process become a part or the whole of the upper level metal lines and the subtractive RIE for metal line formation over-etches the metal of vias which are exposed to RIE due to the misalignment of the metal line to the via. As a result, the upper metal lines and vias have no interface or junction, and sections of misaligned vias are etched away during over-etching of subtractive RIE to create a suitable distance for Vmax and TDDB. The subtractive RIE metal lines can thus be formed with vias to resolve high line resistance issues. Furthermore, the substrative metal line with gap fill approach will also minimize the Plasma RIE and PVD liner deposition damage normally observed with damascene process. Thus, this approach will further reduce the overall C even with or without the airgap formation.

Substrate 102 may comprise a semiconducting material, an insulating material, a conductive material or any combination thereof. In an embodiment, substrate 102 may comprise a semiconducting material, any semiconductor such as Si, SiGe, SiGeC, SiC, Ge alloys, GaAs, InAs, InP and other III/V or II/VI compound semiconductors may be used. In addition to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs).

In an embodiment, substrate 102 may be an insulating material, the insulating material can be an organic insulator, an inorganic insulator or a combination thereof including multilayers. In an embodiment, substrate 102 may be a conducting material, substrate 102 may include, for example, polySi, an elemental metal, alloys of elemental metals, a metal silicide, a metal nitride or combinations thereof including multilayers. In an embodiment, substrate 102 may comprise a semiconducting material, one or more semiconductor devices such as, for example, complementary metal oxide semiconductor (CMOS) devices can be fabricated thereon. In an embodiment, substrate 102 may comprise a combination of an insulating material and a conductive material, the substrate may represent a first interconnect level of a multilayered interconnect structure.

Metal interconnect 104A, 104 B, and 104C can be a conductive material or combination of materials suitable for integrated circuit. For example, Metal interconnect can be comprised of copper (Cu), aluminum (Al), tungsten (W), ruthenium (Ru), Rhodium (Rh), Iridium (Ir) or cobalt (Co) or other low resistance Binary Metal such as AlCu or CuMn. Metal interconnect can be fabricated using any technique known in the art, such as, for example, a single or dual damascene technique.

Dielectric 106A, 106B, 106C, and 106D can include, but is not limited to, ultra-low-k (ULK) materials, (e.g., porous silicates, carbon doped oxides, silicon dioxides, silicon nitrides, silicon oxynitrides, carbon-doped silicon oxide (SiCOH) and porous variants thereof, (silsesquioxanes, siloxanes, or other dielectric materials having, for example, a dielectric constant in the range of about 2 to about 4)).

One example of a material suitable for the low-k materials for the dielectric 106 A-D can include silicon oxycarbonitride (SiOCN) or C-Rich Silicon Carbon Nitride (C-Rich SiCN). Other low-k materials that can also be used for the low-k material layer can include fluorine doped silicon dioxide, carbon doped silicon dioxide, porous silicon dioxide, porous carbon doped silicon dioxide, organosilicate glass (OSG), diamond-like carbon (DLC) and combinations thereof.

In some embodiments, the dielectric 106 A-D can be conformally deposited over a substrate (not shown) using CVD. Variations of CVD processes suitable for forming the first dielectric layer include, but are not limited to, Atmospheric Pressure CVD (APCVD), Low Pressure CVD (LPCVD) and Plasma Enhanced CVD (PECVD), Plasma Assisted Atomic Layer Deposition (PA-ALD), Atomic Layer Deposition (ALD), Metal-Organic CVD (MOCVD) and combinations thereof can also be employed.

Air gap 108A and 108 B are an open sections within the integrated circuit. It is an empty area with the purpose of reducing the dielectric constant between interconnects. Empty relates to there being no solid matter within the space, rather it is atmospheric air or other suitable gaseous material with a low-k. Air gap 108 is surrounded on its vertical sides by graphene layer 110 and sits upon substrate 102. Air gap 108 is capped on its upper portion by dielectric 106. Air Gap 108 is formed through secondary means (i.e., it is the result of fabrication of a combination other portions of the invention).

Graphene layer 110A, 110B, 110C, 110D, 110E, and 110F can be an ultra-thin layer (0.2-1.0 nm) of graphene composed of one or more monolayers (i.e., a single atom thick). Graphene layer 110A, 110B, 110C, 110D, 110E, and 110F can be deposited on metal interconnect 104 via a CVD-based process and a carbon precursor such as acetylene. Graphene layer acts as a barrier to prevent diffusion of metal ions from metal interconnect 104, prevents metal oxide formation, and improves interface scattering and resistance.

Advantageously, the graphene layer 110 A-F acts as a metal barrier layer between metal interconnect 104 and dielectric 106 and improves interface scattering and resistance. The carbon from a solid carbon source can be effectively crystallized as graphene at the metal-substrate interface, and also form a layer of graphene on top of the metal. Notably, this process can be carried out at temperatures of less than or equal to about 260° C. As such, these low temperatures will prevent damaging structures such as the dielectric 102 (which can occur at temperatures exceeding 600° C.).

In an embodiment, the annealing conditions include, but are not limited to, a temperature of less than about 600° C. (e.g., from about 25° C. to about 260° C.), and in a duration range of 1 minute to about 30 minutes.

In another embodiment, graphene layer 110 A-F can selectively deposit graphene growth by plasma-enhanced chemical vapor deposition (PECVD) on a metal layer (i.e., metal interconnect 104) can be used to form graphene layers both on top of the metal layer and below the metal layer at the metal-dielectric interface. This process can be carried out at a temperature of 400° C.

Electrode 112A, 112B, and 112C is positioned overlying substrate 102 and under metal interconnect 104A, 104B, and 104C, respectively. Electrode 112A, 112B, and 112C are conductive and can be made from a metal such as, for example, titanium (Ti), vanadium (V), chromium (Cr), manganese (Mn), iron (Fe), cobalt (Co), nickel (Ni), silver (Ag), gold (Au), aluminum (Al), copper (Cu), tungsten (W), molybdenum (Mo) and alloys, such as tungsten nitride (WN), tungsten carbide (WC), or multilayered stacks thereof.

Figure 5:
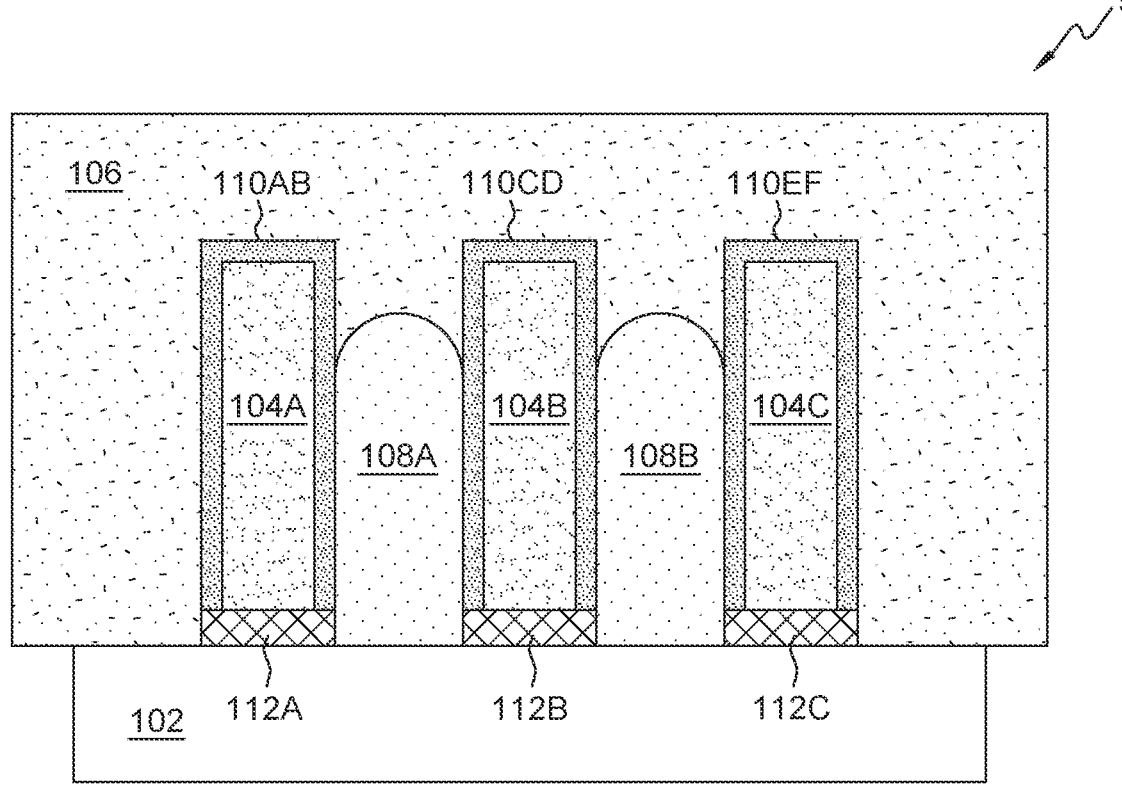
FIG. 5 is a cross-sectional view of graphene coated metal interconnect structure 400 after formation planarization of dielectric 106, generally depicted as structure 500, in accordance with at least one embodiment of the present invention.
Figure 6:
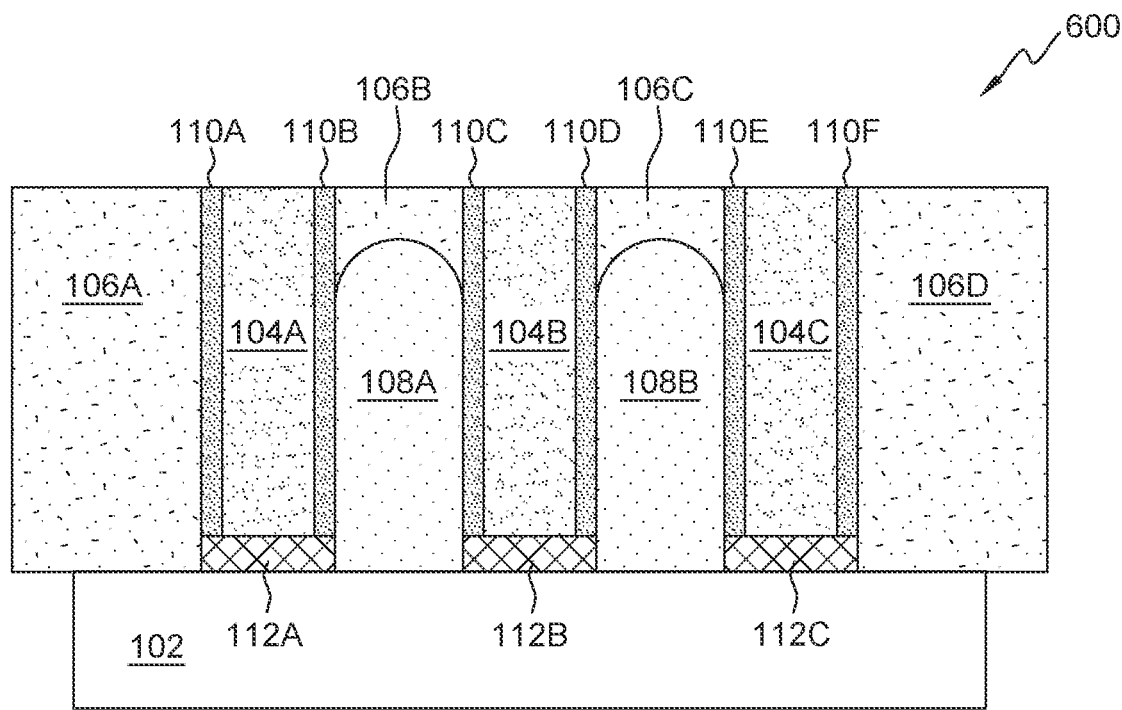
FIG. 6 is a cross-sectional view of graphene coated metal interconnect structure 500 after further planarization exposing the top of metal interconnect structure 104, generally depicted as structure 600, in accordance with at least one embodiment of the present invention.
Figure 7:
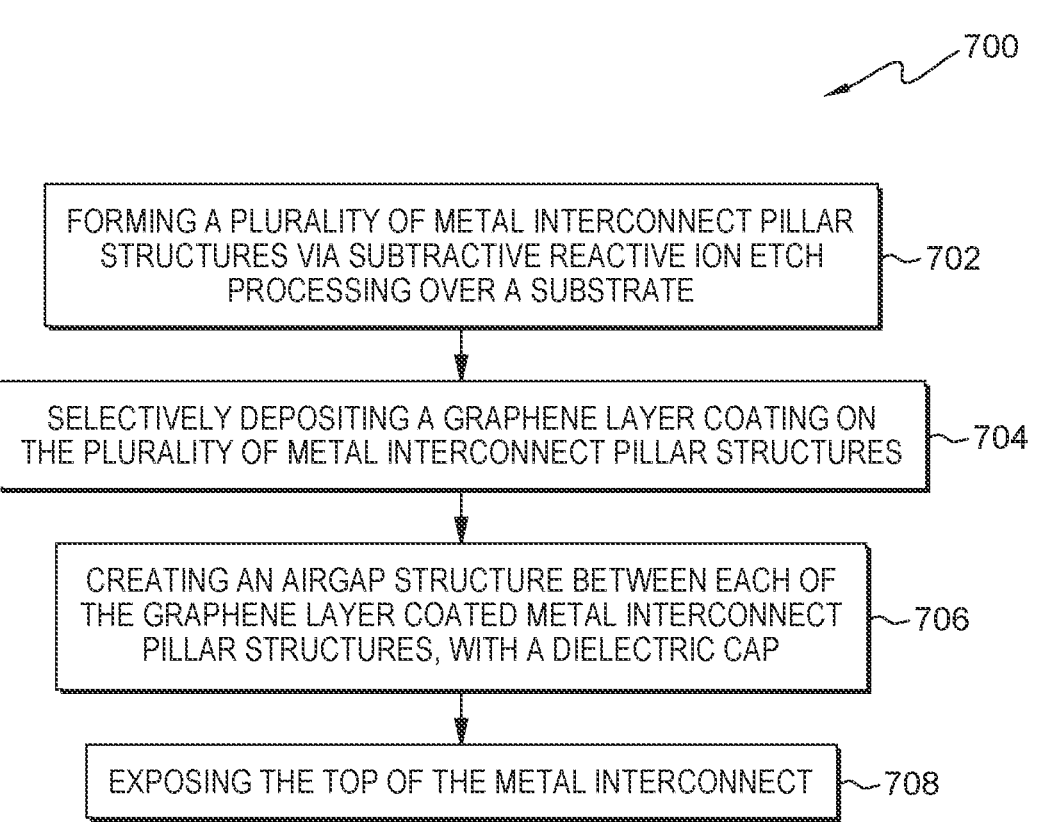
FIG. 7 is a flow-chart depicting the steps to fabricate graphene coated metal interconnect structure 100 in accordance with at least one embodiment of the present invention.

The following description of FIGS. 2-6, illustrate embodiments of the invention and correspond to steps illustrated in the flow chart of FIG. 7.

Figure 2:
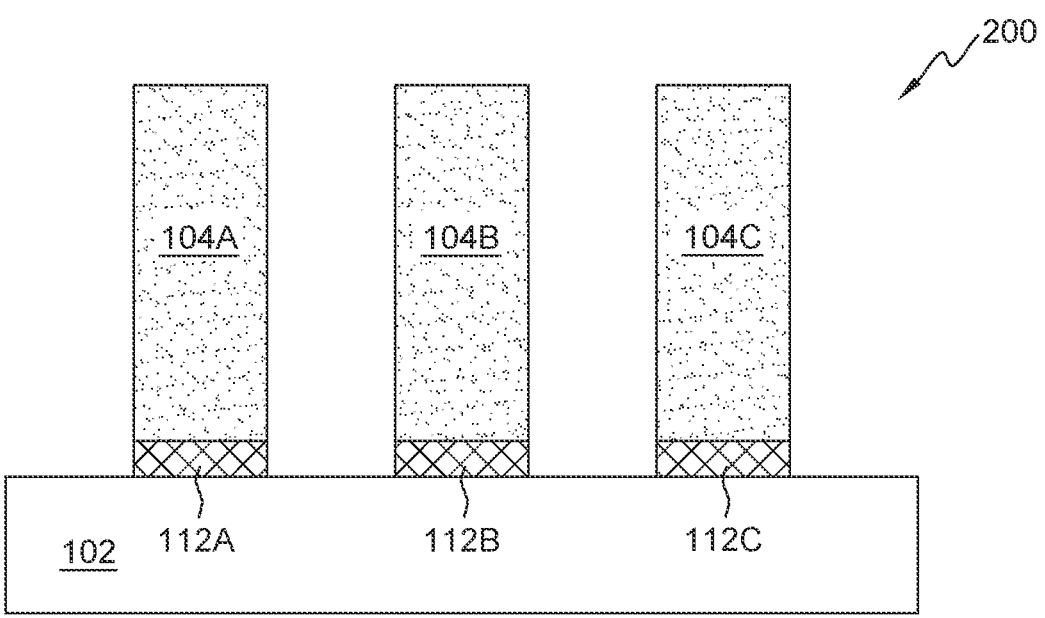
FIG. 2 illustrates a cross-sectional view of graphene coated metal interconnect structure after formation via metal subtractive reactive ion etching, generally designated 200, in accordance with at least one embodiment of the present invention.

Referring now to FIG. 2, FIG. 2 illustrates a cross-sectional view of a metal interconnect structure 200 formed by subtractive reactive ion etch, generally designated 200, in accordance with at least one embodiment of the present invention. Metal interconnect structure 200 has substrate 102 as a base layer, with electrode 112A, 112B, and 112C overlying substrate 102. Overlying electrode 112A, 112B, and 112C are metal interconnect 104A, 104B and 104C, respectively. The overlying metal interconnect 104 generally covers the entire top horizontal surface of electrode 112A, 112B, and 112C while the vertical sides of each electrode are exposed.

Figure 3:
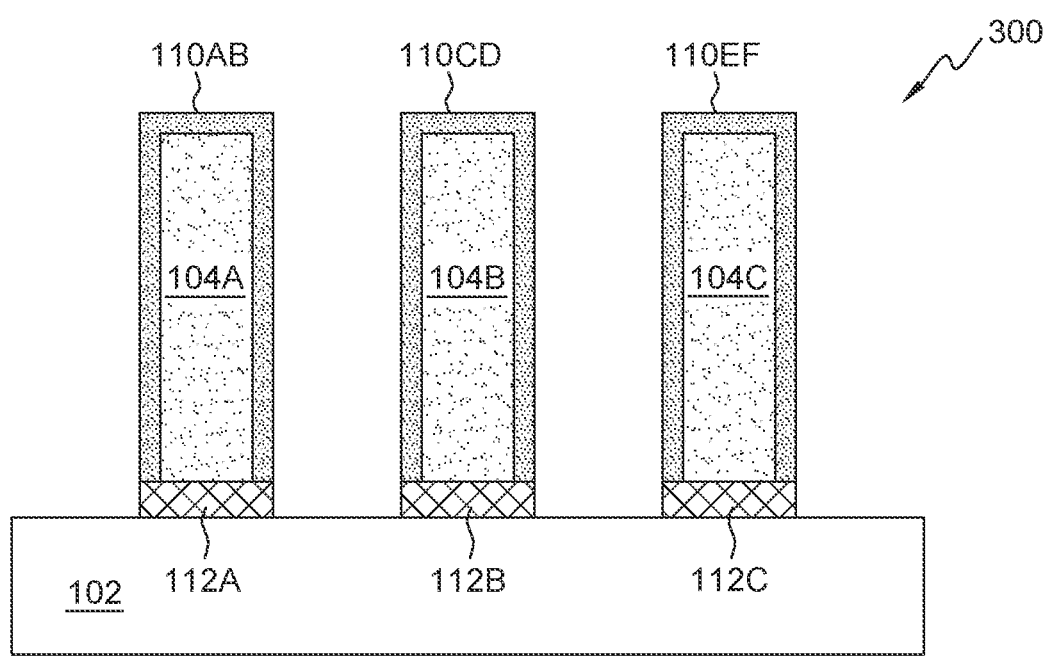
FIG. 3 is a cross-sectional view of graphene coated metal interconnect structure 200 after selective deposition of hydrophobic graphene layer 110, generally depicted 300, in accordance with at least one embodiment of the present invention.

FIG. 3 shows, metal interconnect structure, generally designated 300, after selective deposition of a graphene layer on metal interconnects Graphene layer 110AB, 110 CD, and 110EF is selectively deposited on metal interconnect 104A, 104B, and 104C. In an embodiment, graphene layer is deposited via PECVD. This step removes any metal oxide that has formed on metal interconnect 104, while growing or depositing ultrathin monolayers of graphene on metal interconnect. 104. FIG. 3 shows the deposition on the exterior sides and top of metal interconnect 104. It should be understood, deposition of graphene layer 110 will completely cover any exposed surface of metal interconnect 104 or any exposed surface of metal interconnect selected.

Figure 4:
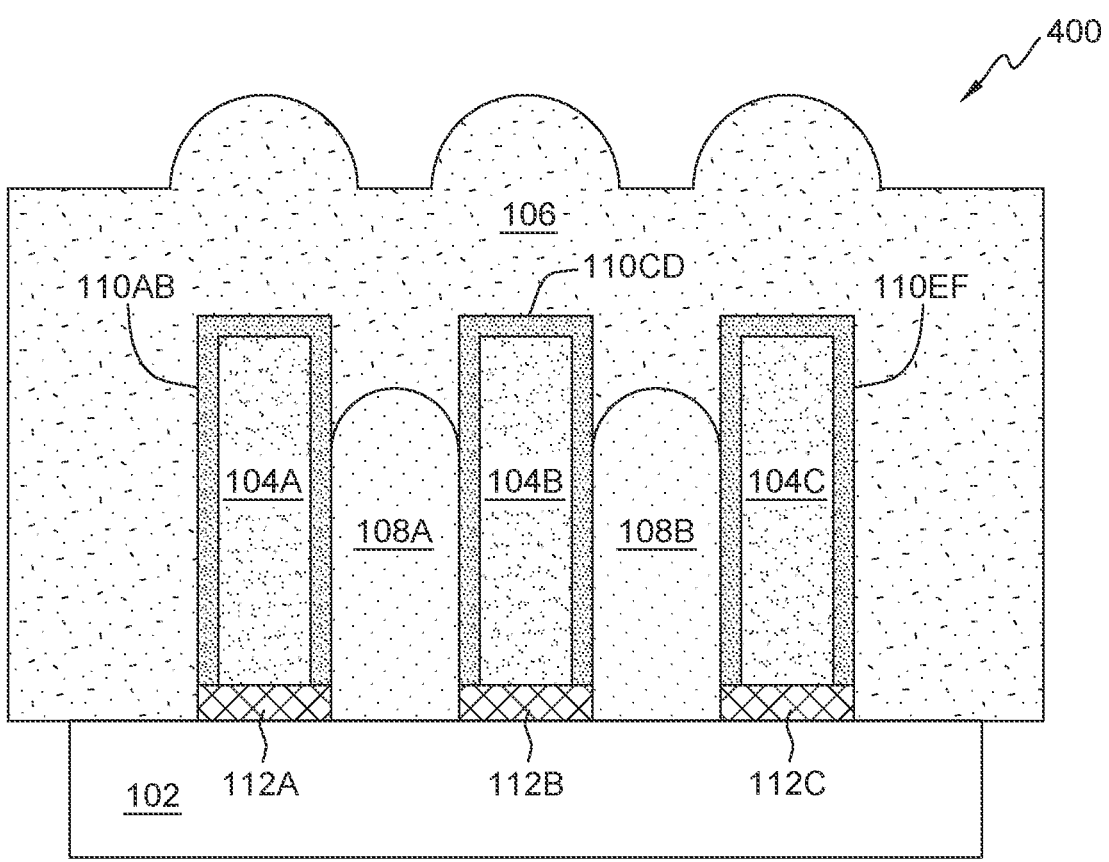
FIG. 4 is a cross-sectional view of graphene coated metal interconnect structure 300 after formation of airgaps 108, generally designated 400, in accordance with at least one embodiment of the present invention.

FIG. 4 shows metal interconnect structure generally designated 400, after fabrication of air gap structure due to deposition of dielectric. Metal interconnect structure 400 is comprised of dielectric 106 deposited on the surface of metal interconnect structure 300. It should be noted, air gap 108 is formed because of this deposition. The trench between the metal interconnect 104 pillars will be sub-20 nm, the dielectric will be prevented from depositing within this trench due to the surface tension of the material itself during deposition, thus forming the airgap structure. It should be noted, Air gap 108 can be within the range of 8-14 nm wide. In other words, in some embodiments, the open space (i.e. air gap) between the graphene layers on the metal interconnect pillars can be between 8-14 nm wide.

FIG. 5 shows metal interconnect structure, generally designated 500, after planarization of dielectric 106 on metal interconnect structure 500. Dielectric 106 is planarized to provide a flat surface parallel to substrate 102. The planarization provides a better working area for subsequent steps and reduces potential waste of metal interconnect 104 and graphene layer 110.

FIG. 6 shows metal interconnect structure generally designated 600, after planarization exposing the top of metal interconnect structure and removing the perpendicular portion of graphene layer overlying metal interconnect structure. A process such as CMP can be performed to planarize the top portion of metal interconnect structure 600. This process results in the embodiment described in FIG. 1. Further, the removal of the top perpendicular portion of graphene layer 110AB, 110CD, and 110EF, results in the formation of graphene layer 110A, 110B, 110C, 110D, 110E, and 110F. It should be noted, this nomenclature is for sake of the FIGS. 1 and 6, as the graphene layer will envelope the vertical sides of the respective metal interconnect 104 pillar structure.

Referring now to FIG. 7. FIG. 7 is a flow chart generally designated 700 of the process for forming graphene coated metal interconnect structure with airgap 100. At step 702, form a plurality of metal interconnect 104 structures on electrode 112 and substrate 102 via a subtractive metal RIE process. The resulting structure corresponds to metal interconnect structure 200. In an embodiment, a plurality of metal interconnect structures can be formed via subtractive metal RIE.

At step 704, graphene layer 110, is selectively deposited on metal interconnect 104 on metal interconnect structure 200. In an embodiment, graphene layer 110 is selectively deposited on metal interconnect structure 110 via PECVD, this may be a hydrophobic selective process. Graphene layer 104 may be one or more layers thick and only deposited on metal interconnect structure 104. Thus, resulting in the metal interconnect structure 300.

At step 706, create an air gap 108 between the each graphene layer 110 coating the metal interconnect 104 pillar structure. In an embodiment, dielectric 106 is deposited on metal interconnect structure 300. The result of the deposit of dielectric 106 is the formation of airgap 108 between each of the graphene coated metal interconnects. The dielectric also surrounds the horizontal sections of exposed substrate 102, thus resulting in dielectric overlying substrate 102 and contacting the exterior vertical surfaces of graphene layer (i.e., the vertical surface not in contact with airgap 108).

At step 708, the top of metal interconnect structure 104 is exposed. In an embodiment, the top portion of metal interconnect structure 500 is planarized via an appropriate process. this exposed the top of metal interconnect 104 and removes the overlying graphene layer 110 and dielectric 106. In an embodiment, the resulting structure corresponds to graphene coated metal interconnect structure with airgap 100.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein.

In addition, any specified material or any specified dimension of any structure described herein is by way of example only. Furthermore, as will be understood by those skilled in the art, the structures described herein may be made or used in the same way regardless of their position and orientation. Accordingly, it is to be understood that terms and phrases such as, for instance, "side", "over", "perpendicular", "tilted", etc., as used herein refer to relative location and orientation of various portions of the structures with respect to one another and are not intended to suggest that any particular absolute orientation with respect to external objects is necessary or required.

The foregoing specification also describes processing steps. While some of the steps may be in an ordered sequence, others may in different embodiments from the order that they were detailed in the foregoing specification. The ordering of steps when it occurs is explicitly expressed, for instance, by such adjectives as, "ordered", "before", "after", "following", and others with similar meaning.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature, or element, of any or all the claims.

Many modifications and variations of the present invention are possible in light of the above teachings, and could be apparent for those skilled in the art.

What is claimed is:

1. A metal interconnect semiconductor structure with an airgap, comprising:
   a first electrode and a second electrode in contact with a substrate;
   a first metal interconnect in electrical contact with the first electrode and a second metal interconnect in electrical contact with the second electrode;
   a first graphene layer coating sidewalls of the first metal interconnect, forming a first metal interconnect pillar structure;
   a second graphene layer coating sidewalls of the second metal interconnect, forming a second metal interconnect pillar structure;
   a dielectric layer located between the first and second metal interconnect pillar structures, and in contact with an upper portion of the first and second metal interconnect pillar structures; and
   an airgap located between the first and second metal interconnect pillar structures, and in contact with a bottom portion of the first and second metal interconnect pillar structures;
   wherein:
   the first and second metal interconnects and the first and second graphene layers have top surfaces that are coplanar with a top surface of the dielectric layer.

2. The metal interconnect semiconductor structure of claim 1, wherein the first and second metal interconnect structures are comprised of cobalt.

3. The metal interconnect semiconductor structure of claim 1, wherein the first and second metal interconnect structures are comprised of ruthenium.

4. The metal interconnect semiconductor structure of claim 1, wherein the first and second metal interconnect structures are comprised of tungsten.

5. The metal interconnect semiconductor structure of claim 1, wherein the first and second graphene layers have a thickness between 0.2 nanometers ("nm") and 1.0 nm.

6. The metal interconnect semiconductor structure of claim 1, wherein the airgap structure has a span between 8.0 nm and 12.0 nm.

7. The metal interconnect semiconductor structure of claim 1, wherein the first and second electrodes are comprised of tungsten nitride.

8. The metal interconnect semiconductor structure of claim 1, wherein the dielectric layer is comprised of carbon rich SiCN.

* * * * *